(12) United States Patent
Horiuchi et al.

(10) Patent No.: US 6,407,344 B1
(45) Date of Patent: Jun. 18, 2002

(54) MULTILAYER CIRCUIT BOARD

(75) Inventors: Michio Horiuchi; Takashi Kurihara, both of Nagano (JP)

(73) Assignee: Shinko Electric Industries Co., Ltd, Nagano (JP)

( * ) Notice: Subject to any disclaimer, the term of this patent is extended or adjusted under 35 U.S.C. 154(b) by 0 days.

(21) Appl. No.: 09/631,397

(22) Filed: Aug. 3, 2000

(30) Foreign Application Priority Data

Aug. 6, 1999 (JP) .......................................... 11-223953

(51) Int. Cl.$^7$ ................................................ H01R 9/09
(52) U.S. Cl. ........................ 174/261; 174/262; 257/692; 257/690; 257/698
(58) Field of Search ................................ 174/255, 261, 174/262, 263; 361/772, 767, 791, 760; 257/690, 692, 697, 686, 698

(56) References Cited

U.S. PATENT DOCUMENTS

| | | | | |
|---|---|---|---|---|
| 5,691,569 A | * | 11/1997 | Palmer | 257/692 |
| 5,847,936 A | * | 12/1998 | Forehand et al. | 361/760 |
| 6,104,088 A | * | 8/2000 | Hatano et al. | 257/698 |
| 6,215,320 B1 | * | 4/2001 | Parrish | 428/209 |

FOREIGN PATENT DOCUMENTS

| | | |
|---|---|---|
| EP | 0 116 119 A2 | 8/1984 |
| EP | 0 883 182 A2 | 12/1998 |
| EP | 0 928 029 A2 | 7/1999 |

OTHER PUBLICATIONS

Search report issued out of The Hauge on application No. EP–00–30–6646.

* cited by examiner

*Primary Examiner*—Albert W. Paladini
(74) *Attorney, Agent, or Firm*—Paul & Paul

(57) ABSTRACT

A multilayer circuit board comprising a plurality of laminated routing layers, which is used to mount thereon an electronic part, such as a semiconductor chip or device, provided with electrodes formed in a certain pattern, each of the routing layers being provided with lands and routing lines on its surface, the lands being arranged to conform to the pattern of the electrodes of the electronic part, and the routing line being connected at its end to the land, and being routed toward the outside from a region where the lands are arranged, wherein the lands on each of the routing layers are arranged to have a pattern in which a closed virtual line formed by consecutively linking the peripheral lands at least partially has concave sections. Preferably, the concave section is in the form of a rectangular equilateral triangle, and the peripheral lands are located along the sides of the rectangular equilateral triangle. Alternatively, the concave section may be in the form of a pseudo-rectangular equilateral triangle having a rectangular vertex at which one of the peripheral lands is located, and a cutout at an intersection of its hypotenuse and one of equilaterals. The multilayer circuit board has a reduced number of routing layers relative to conventional multilayer circuit boards, and can be produced with an increased yield and high reliability.

19 Claims, 14 Drawing Sheets

MULTILAYER CIRCUIT BOARD

BACKGROUND OF THE INVENTION

1. Field of the Invention

The invention relates to a Multilayer circuit board used to mount, on a component such as a print-circuit board, an electronic part such as a semiconductor chip having connection electrodes arranged in the form of a lattice or a semiconductor device having external connection terminals arranged in the form of an area array.

2. Description of the Related Art

With recent semiconductor devices, logic devices are becoming highly functional and highly integrated, and the numbers of inputs and outputs have increased, resulting in a greatly increased mounting density. Accordingly, products which compensate for a lack of space for the formation of electrodes by arranging electrodes in a lattice pattern on the electrode-forming face of a semiconductor chip, have been provided.

FIG. 18 illustrates an example in which a semiconductor chip 4 is mounted on a circuit board 5 by conventional flip chip bonding. The semiconductor chip 4 has electrodes 6 arranged on the peripheral region thereof, the electrodes 6 being respectively connected to routing lines (wiring lines) 7 provided on the surface of the board 5.

FIG. 19 illustrates the arrangement of lands 8 and routing lines 7 provided on a circuit board for mounting a semiconductor chip (not shown). In this example, the lands 8 are arranged in two sequences corresponding to those of electrodes provided on the chip, the routing lines 7 from the lands 8 of the inner sequence being passed through between the adjacent lands 8 of the outer sequence. Thus, the respective routing lines 7 are routed out from the respective land 8 on the same plane (the surface of the circuit board).

When electrodes are arranged in more sequences on the electrode-forming face of a chip, however, it may no longer be possible to route out respective routing lines from respective lands on the same plane, depending upon the distance between the adjacent lands and the total number of lands.

To solve such a problem, a method has been proposed in which a circuit board for mounting a semiconductor chip is made so as to have a number of routing layers, each of the layers having patterned routing lines appropriately arranged thereon, to thereby connect some of electrodes of the chip with the respective routing lines. FIG. 20 schematically shows an example in which a semiconductor chip 4 provided with a number of electrodes 6 arranged in a lattice pattern is mounted on a multilayer circuit board 5' comprising four routing layers 5a, 5b, 5c, and 5d. Using such a multilayer circuit board, it is possible to electrically connect the respective electrode 6 of the chip 4 with the respective routing lines 7a, 7b, 7c, 7d of the multilayer circuit board 5', which are, in turn, connected with an external connection terminal 9 of the multilayer circuit board 5', through which the chip 4 is ultimately electrically connected to an external electrical circuit of a component such as a printed circuit board (not shown).

When a semiconductor chip having a smaller number of electrodes arranged in a lattice pattern is to be mounted on a component, such as a printed circuit board, using a multilayer circuit board, it is sufficient that two or three routing layers are laminated to form the multilayer circuit board. However, if the semiconductor chip has as many as, for example 30×30 or 40×40 electrodes, much larger number, for example 6 to 10, of routing layers are required for the multilayer circuit board.

When a plurality of routing layers, on each of which patterned routing lines are densely formed, are to be laminated to provide a multilayer circuit board, a high-density routing method such as build-up method is employed. In the production of a multilayer circuit board by such a method, however, there are serious problems in terms of yield and reliability of the products, and the cost of production. Specifically, in the case of the production of the multilayer circuit board 5' as illustrated in FIG. 20, the routing layers 5a, 5b, 5c, and 5d are successively laminated, while vias 3 are formed in each wiring layer 5a, 5b, 5c, 5d to secure an electric connection between the electrodes 6 of the chip 4 and the routing lines 7b, 7c, 7d on the routing layers 5b, 5c, 5d, or between the routing lines 7a, 7b, 7c, 7d on the layers 5a, 5b, 5c, 5d and the external connection terminals 9. Accordingly, the production process requires a high degree of precision, and does not necessarily provide higher reliability even at present. Also, in the case of the production of the multilayer circuit board, it is required that none of the layers to be laminated is defective, which increases in technical difficulty.

Consequently, to produce a reliable multilayer circuit board in a satisfactory yield, it would be very effective to reduce the number of routing layers.

SUMMARY OF THE INVENTION

The present invention relates to a multilayer circuit board for mounting thereon an electronic part such as a semiconductor chip or device having a large number of electrodes, for example as many as 40×40 electrodes, arranged in a certain pattern, such as a lattice pattern, on a side facing the multilayer circuit board, and aims to provide a multilayer circuit board product of high reliability, which has a reduced number of routing layers and can consequently be produced with an increased yield.

Thus, the invention provides a multilayer circuit board comprising a plurality of laminated routing layers, which is used to mount thereon an electronic part, such as a semiconductor chip or device, provided with electrodes formed in a certain pattern, each of the routing layers being provided with lands and routing lines on its surface, the lands being arranged to conform to the pattern of the electrodes of the electronic part, and the routing line being connected at its end to the land, and being routed toward the outside from a region where the lands are arranged, wherein the lands on each of the routing layers are arranged to have a pattern in which a closed virtual line formed by consecutively linking the peripheral lands at least partially has concave sections.

Preferably, the concave section is in the form of a rectangular equilateral triangle, and the peripheral lands are located along the sides of the rectangular equilateral triangle.

In some cases, the concave section may be in the form of a pseudo-rectangular equilateral triangle having a rectangular vertex at which one of the peripheral lands is located, and a cutout at an intersection of its hypotenuse and one of the equilaterals.

BRIEF DESCRIPTION OF THE DRAWINGS

The above and other objects and advantages of the invention will be well understood and appreciated by a person with ordinary skill in the art, after considering the following detailed description made by referring to the attached drawings, wherein.

DETAILED DESCRIPTION OF THE INVENTION

Figure 1:
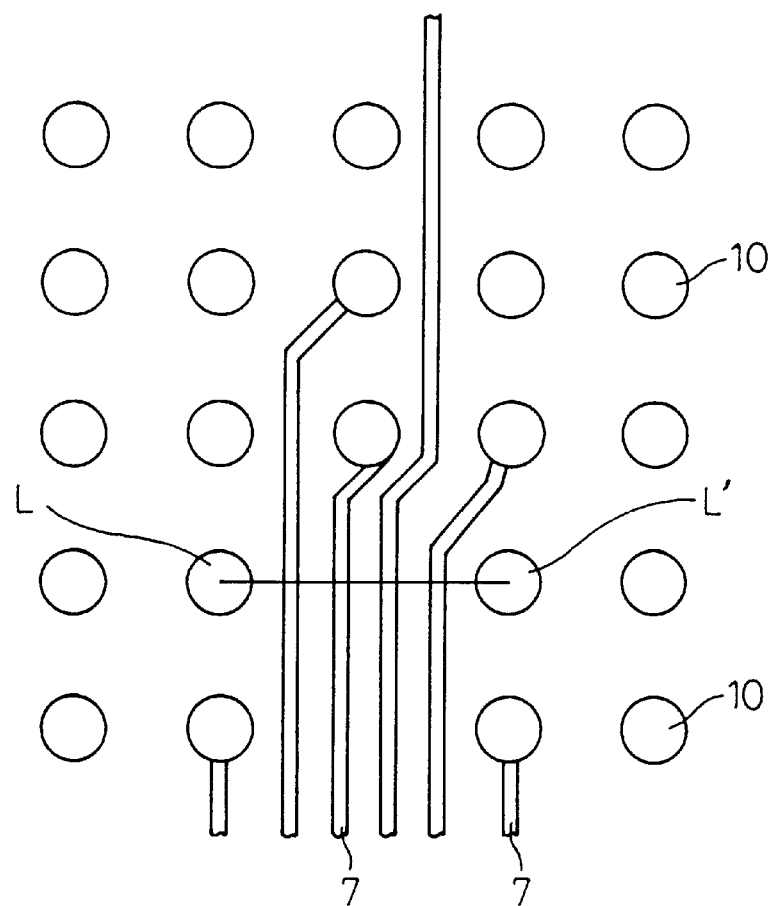
FIG. 1 illustrates a typical example of lands and routing lines in a routing layer of a multilayer circuit board of the invention.

The invention provides a multilayer circuit board comprising a plurality of laminated routing layers, which is used to mount thereon an electronic part, such as a semiconductor chip or device, provided with a large number of electrodes formed in a certain pattern, and is, in turn, mounted on another board component, such as a printed circuit board, each of the routing layers being provided with lands and routing lines on its surface, and with vias going through the routing layer for electrical conduction from one side to the other side of the routing layer, the lands being arranged to conform to the pattern of the electrodes of the electronic part, and the routing line being connected at its end to the land, and being routed toward the outside from a region where the lands are arranged, wherein the lands and the routing lines in each routing layer are arranged so as to decrease the number of routing layers required to fabricate the multilayer circuit board. The multilayer circuit board may be produced by any of various processes known in the art, such as a build-up process.

Electrodes of an electronic part such as a semiconductor chip or device are usually arranged in a normal lattice or staggered pattern. What is particularly problematic is the case of the electrodes arranged in a normal lattice pattern, in which case routing lines on a routing layer of a multilayer circuit board are difficult to pass through between lands on the routing layer which follow the lattice pattern of the electrodes of the electronic part, rather than the case of the staggered pattern. In the case of a normal lattice pattern, what is important is how the lands and the routing lines are arranged in order to efficiently route the routing lines with a least number of routing layers laminated.

In every routing layer, the routing lines from inner lands must be arranged so as to pass through between outer lands. In a practical design of routing lines, they must be routed depending upon various conditions such as a pitch between adjacent lands, a diameter of the land, a width of the routing line, a distance between adjacent routing lines and the like.

According to the invention, the routing lines can be efficiently arranged and the number of laminated wiring layers can be decreased, by arranging the lands and the routing lines in each of the routing layers of a multilayer circuit board, based on the following.

By way of example, an arrangement of routing lines for a normal lattice land arrangement in which lands are arranged in the longitudinal and transverse directions maintaining an equal distance from each other, will be described.

With serial lands in a number of "n" arranged to have a fixed pitch, if all intermediate lands of the number of (n−2) are eliminated to leave a free space between the lands at both extreme ends, the number "m" of the routing lines which can be passed through between the lands at both ends, excluding the lines rerouted out from the lands at the both ends, is then given by the formula, $$m=[(\text{land pitch})\times(n-1)-(\text{land diameter})-(\text{space between lines})]\div(\text{line width}+\text{space between lines}),$$

where the land pitch is a distance between the centers of the adjacent lands, the land diameter is a diameter of the land, the line width is a width of the routing line, and the space between lines is a minimum distance that must be maintained between the routing lines.

If it is considered that only one routing line is allowed to pass through between the adjacent lands, the number "k" of routing lines which can be arranged between the lands at the two extreme ends after the elimination of the intermediate lands is then given by, $$k = (n-1) + (n-2)$$
$$= 2n - 3.$$

This means that there are (n−1) channels that permit the passage of routing lines among the lands of a number of "n", and that there are intermediate lands of a number of (n−2) excluding the lands at the both extreme ends, each of which a routing line can be connected to.

Accordingly, upon comparing m with k, there is obtained no effect for increasing the routing lines in the case of m=k, even if the intermediate lands are all eliminated from among the serial lands of a number of "n". In the case of m≧(k+1), on the other hand, there is obtained the effect for increasing the routing lines when the intermediate lands are eliminated, To decrease the number of laminated routing layers in a multilayer circuit board, it is thus effective to route as many routing lines as possible from a region where the lands are arranged. As described above, when m≧(k+1), the routing lines can be routed in an increased number by eliminating the intermediate lands except the lands at both extreme ends. Consequently, in this example, by selecting, with the integer "n" as a parameter, a value "n" that satisfies m≧(k+1), and arranging the routing lines according to the selected value "n", the number of laminated routing layers in a multilayer circuit board can be effectively decreased.

In the above example, the routing lines are arranged for serial lands in a number of "n" through a procedure in which the value "m" is determined from the given conditions of a land pitch, a land diameter, a line width, and a line space, the value "m" is subsequently compared with the value "k" to know if "n" satisfies m≧(k+1), the intermediate lands of a number (n−2) is then eliminated, and the routing lines are preferentially passed through the free space resulted from the elimination of the intermediate lands (i.e., the zone where the sequence of lands of the number (n−2) is eliminated).

FIG. 1 illustrates a case where routing lines are arranged in an increased number when n=3. In the drawing, a distance between lands indicated by L and L' represents the twice the land pitch. If there is an intermediate land between lands L and L', there are arranged three routing lines therebetween, including a routing line from the intermediate land and two routing lines passing through two spaces or channels, which are defined between the adjacent lands.

On the other hand, when the intermediate land is removed from the space between lands L and L' as shown in FIG. 1, and an additional wiring line is allowed to be passed through the space between lands L and L', four routing lines 7 can be passed though the space as shown in the drawing. Thus, removing the intermediate land from the three consecutively arranged lands makes it possible to pass one extra wiring line through between the lands at both extreme ends, L and L', compared to when the intermediate land existed. It will thus be understood that, in this example, the routing lines are efficiently arranged as a result of removing every other land from the transverse groups of three lands.

In the foregoing was described the case where only one routing line can be passed through between the adjacent lands. Quite the same idea can also be applied to even for a case where the routing lines of any number of "a" can be passed through between the adjacent lands.

In this case as well, assuming that serial lands in a number of "n" are arranged to have a fixed pitch, and intermediate lands of the number of (n−2) are eliminated to leave the lands at the two extreme ends, the number "m" of routing lines which can be passed through the space between the lands at the two extreme ends is then given by the formula, $$m=[(\text{land pitch})\times(n-1)-(\text{land diameter})-(\text{space between lines})]\div(\text{line width}+\text{space between lines}).$$

When none of the intermediate lands is eliminated, the number of the routing lines which can be arranged between the lands at the two extreme ends is given by the formula, $$k=a\times(n-1)+(n-2).$$

Accordingly, by comparing "m" with "k" with "n" as a parameter, determining a value "n" (integer) that satisfies m≧(k+1), and eliminating the intermediate lands relying upon the value "n", it is possible to efficiently draw the routing lines in a routing layer of a multilayer circuit board.

Thus, also in the case where it is possible to pass a plurality of routing lines through between the adjacent lands, quite the same idea is applied as in the case where only one routing line can be passed through between the adjacent lands, to thereby efficiently arrange the routing lines to increase the number of routing lines passing through the zone of the serial lands of a given number.

As described, arranging routing lines in a routing layer of a multilayer circuit board by comparing "m" with "k" using "n" as a parameter, determining a value "n" (integer) that satisfies m≧(k+1), and eliminating an intermediate land or lands from a sequence of lands depending on the value "n" is effective in efficient arrangement of the routing lines. Since "m" is a number of the routing lines which can be passed through the space between the lands at both extreme ends of a sequence of lands of the number of "n" when all intermediate lands are eliminated from the sequence, it is considered that the value "m" increases with an increase in the value "n", as a rule, and, accordingly, the routing lines can then be arranged further efficiently.

Figure 2:
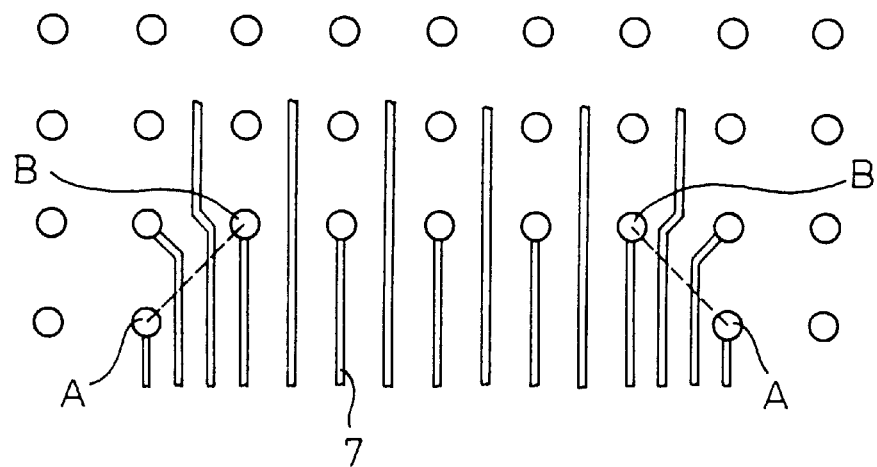
FIG. 2 illustrates another example of lands and routing lines according to the invention.

FIG. 2 illustrates the simplest arrangement at n=7, in which one wiring line can be drawn through between adjacent lands in a normal lattice pattern. As described above, the value "m" increases with an increase in the value "n". In practice, however, simply increasing the value "m" by increasing the value "n" does not necessarily provide an efficient arrangement of routing lines.

In FIG. 2, thirteen wiring lines can be passed through between the lands at both extreme ends of the sequence of seven lands by removing five intermediate lands out of the sequence. In this case, only two routing lines are increased compared with eleven lines which are passed through between the lands at both extreme ends without removing the intermediate lands. Although the five intermediate lands were removed to provide space wide enough for passing more wiring lines, the routing lines cannot actually be passed through the space in so large a number due to the limitation of supplying the routing lines to the space.

In practice, in the case where the routing lines are passed through space created by removing all intermediate lands from an outer sequence of lands, in the condition that all lands in the immediately inner sequence exist, as shown in FIG. 2, what contributes to increasing the number of the routing lines which can be passed through the space are the routing lines arranged in the neighborhoods of both extreme ends in the sequence of the lands. Referring to FIG. 2, two wiring lines are passed through the space between land A of the outer sequence and land B of the inner sequence, and only this space where the two wiring lines are passed through is contributing to increasing the number of the routing lines.

Thus, it is understood that even when the value "n" is so selected that the value "m" becomes as large as possible, the actually effective value of "m" is equal to k+2; it is sufficient that the routing lines are arranged by determining a value "n" with which the number of the routing lines is increased by two relative to the number of the routing lines which could exist without removing the lands.

Also as described above, what most effectively contributes to increasing the number of the routing lines which can be actually arranged is space between land A of the outer sequence and land B of the inner sequence in FIG. 2, which are situated in the direction of diagonal line passing through the land at each of the ends of the outer sequence (land A) and the land at the second from the outermost land of the inner sequence (land B). In other words, it can be said that, in selecting the lands between which the routing lines are to be passed through for the increase in the number of routing lines, it is useful to select the lands of the outer and inner sequences situated in the direction of diagonal line.

Figure 3A:
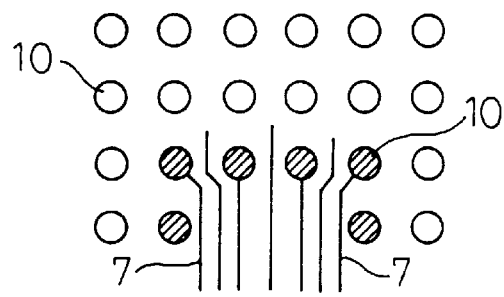
FIGS. 3A to 3C illustrate land and routing line patterns at n (number of serial lands selected to provide a concave section to a land pattern)=4.
Figure 3B:
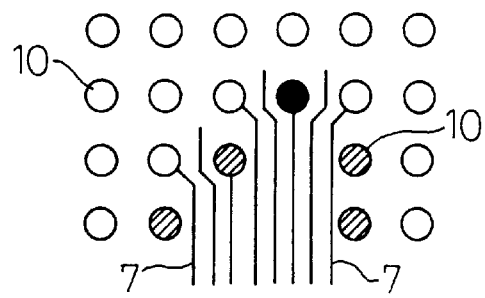
Figure 3C:
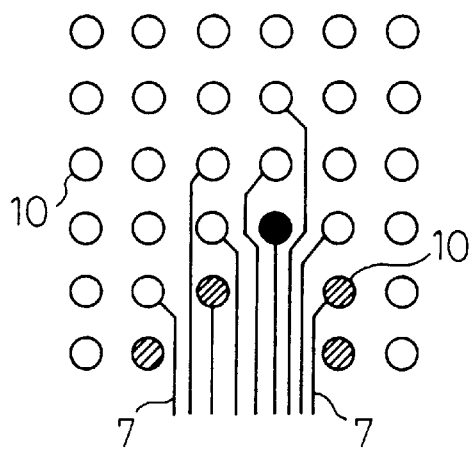

FIGS. 3A to 3C illustrate cases where routing lines are arranged in an increased number when n=4. FIG. 3A illustrates a case where routing lines from inner area of the lattice of lands 10 are passed through between lands 10 simply arranged as an inner transverse sequence, and FIGS. 3B and 3C illustrate cases where routing lines from inner area are selectively passed through between lands 10 which are arranged along diagonal lines. As described above, the conditions for arranging the wiring lines 7 are determined depending upon a land pitch, a land diameter, a line width, and a space between adjacent lines. FIGS. 3A to 3C represent cases where the land pitch is 350 micrometers and the land diameter is 200 micrometers. In FIGS. 3A and 3B, the line width and the line space are both 50 micrometers, and in FIG. 3C, the line width and the line space are both 43 micrometers.

In the case of FIG. 3A where the routing lines from the inner area of the lattice of lands 10 are passed through between adjacent lands 10 which are simply arranged as a transverse sequence, only seven lines 7 are arranged. In the case of FIG. 3B where the routing lines from the inner area are selectively passed through between lands 10 which are arranged along diagonal lines, eight lines can be arranged. Thus, passing the routing lines from the inner area preferentially through between lands 10 which are arranged along diagonal lines is more efficient. In the case of FIG. 3C where smaller line width and space than those in the case of FIG. 3B are used, nine lines can be arranged.

Figure 4A:
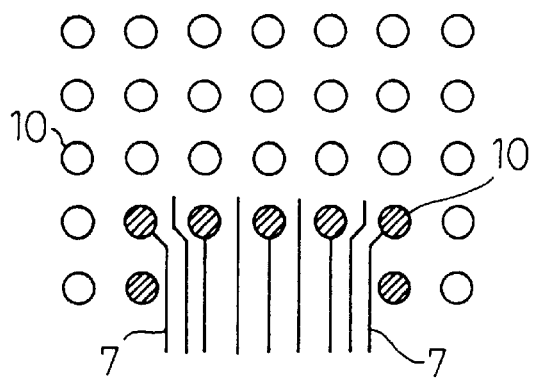
FIGS. 4A and 4B illustrate land and routing line patterns at n=5.
Figure 4B:
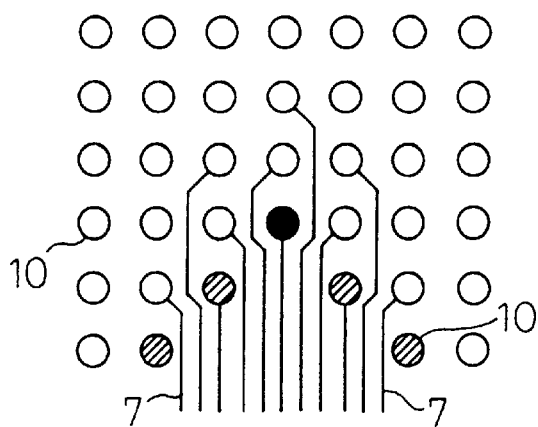

FIGS. 4A and 4B illustrate cases where routing lines are arranged in an increased number when n=5. In these cases, land pitch, land diameter, line width, and line space are 350, 200, 50, and 50 micrometers, respectively. FIG. 4A shows a case where the routing lines from the inner area of the lattice of lands 10 are passed through between adjacent lands 10 which are simply arranged as a transverse sequence. In this case, the number of routing lines arranged is increased by two, and a total of nine lines are routed. FIG. 4B shows a case where the routing lines from the inner area are passed through between lands 10 which are arranged along diagonal lines. In this case, a total of eleven lines are routed.

Figure 5A:
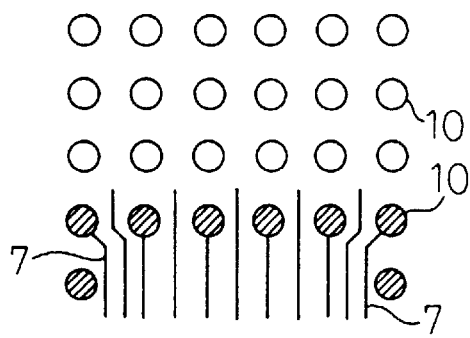
FIGS. 5A to 5C illustrate land and routing line patterns at n=6.
Figure 5C:
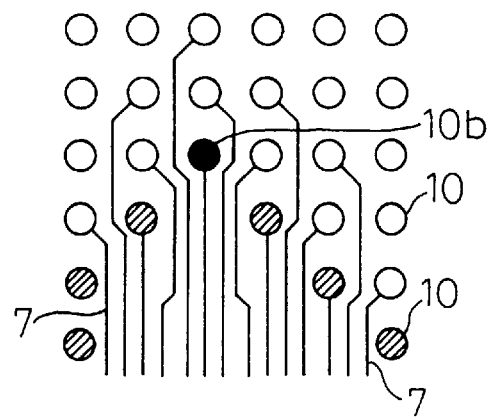
Figure 5B:
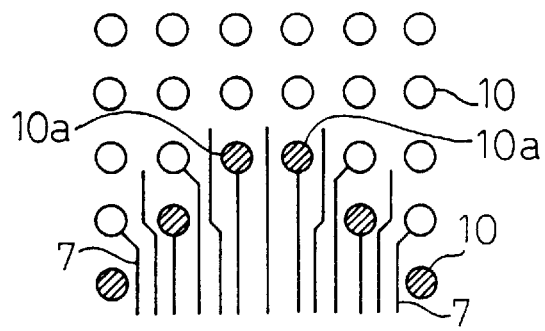

FIGS. 5A to 5C illustrate cases where routing lines are arranged in an increased number when n=6. In these cases, land pitch, land diameter, line width, and line space are 350, 200, 50, and 50 micrometers, respectively. In FIG. 5A, the routing lines from the inner area are passed through between adjacent lands 10 which are simply arranged as a transverse sequence, and a total of eleven lines are routed. In FIG. 5B, there are two diagonal lines respectively intersecting the land indicated by 10a of the third sequence, and a total of thirteen lines are routed. In FIG. 5C, there are two diagonal lines each intersecting the common land indicated by 10b of the fourth sequence, and a total of fourteen lines are routed.

Comparing FIG. 5B with FIG. 5C, the lands are arranged in the diagonal directions more perfectly in FIG. 5C, i.e., the diagonal lines in FIG. 5C extend to deeper land 10b (the land of the fourth sequence) than the land 10a of the third sequence in FIG. 5B, and, accordingly, the number of routing lines in FIG. 5C can more effectively be increased. It turns out that arranging the lands, between which the routing lines are to be passed through, in the diagonal directions as much as possible, in other words, locating the lands, between which the routing lines are to be passed through, on the sides of a rectangular equilateral triangle having a base angle of 45 degrees, to thereby increase the number of pairs of adjacent lands in the diagonal directions (four pairs in FIG. 5B and five pairs in FIG. 5C), is effective to increase the number of routing lines.

Figure 6A:
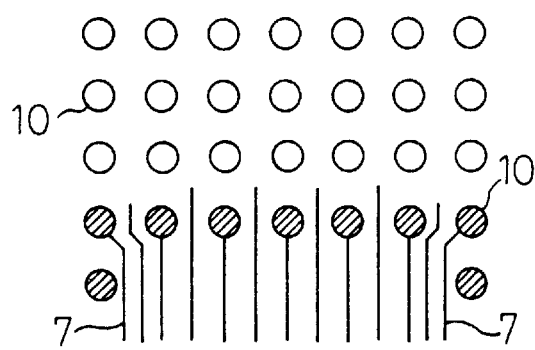
FIGS. 6A and 6B illustrate land and routing line patterns at n=7.
Figure 6B:
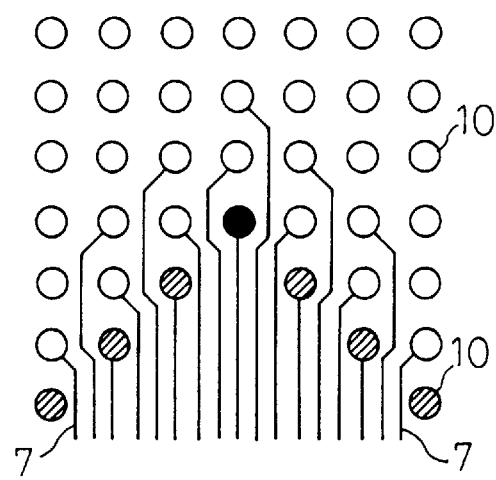

FIGS. 6A and 6B illustrate cases where routing lines are arranged in an increased number when n=7. In these cases, land pitch, land diameter, line width, and line space are 350, 200, 50, and 50 micrometers, respectively. In FIG. 6A, the routing lines from the inner area are passed through between adjacent lands 10 which are simply arranged as a transverse sequence, and a total of thirteen lines are routed. In FIG. 6B, the routing lines from the inner area are passed through between lands 10 which are arranged along diagonal lines, and a total of seventeen lines are routed.

It will thus be understood that the routing lines from the inner area of the lattice of lands 10 can very efficiently be passed through between the lands 10 arranged along diagonal lines, as in the cases illustrated in FIGS. 5B, 5C, and 6B, for example. When "n" is an odd number, the lands can be diagonally arranged on the sides of a complete rectangular equilateral triangle, as shown in FIG. 6B, whereas when "n" is an even number, a complete rectangular equilateral triangle is not formed, as shown in FIGS. 5B and 5C. In the latter case, the arrangement of lands approximating to a rectangular equilateral triangle having a vertex, at which the land indicated by 10b (FIG. 5C) is located and the two diagonal lines are intersected, will provide a maximum number of routing lines.

As will be understood from the foregoing examples described with reference to FIGS. 3A to 6B, the number of routing lines can be increased in each of laminated routing layers of a multilayer circuit board, by arranging the lands in a certain pattern in such a manner that a closed virtual line formed by consecutively linking the peripheral (outermost) lands of an arrangement of lands having a certain pattern, such as a normal lattice pattern, at least partially has concave sections, to thereby reduce the number of laminated routing layers required for the multilayer circuit board. When the lines are routed from a region where a number of lands are arranged in a lattice pattern, it is particularly effective to rout the lines from the inner area of the lattice of lands through between the lands arranged on the sides of an isosceles triangle having a base angle of 45 degrees and having oblique lines in the diagonal directions (i.e., rectangular equilateral triangle) or on the sides of a triangle approximating thereto.

In summary, to efficiently increase the routing lines in each of laminated routing layers of a multilayer circuit board when the lands are arranged in a lattice pattern, it is preferred that the lands are arranged in such a manner that a closed virtual line formed by consecutively linking the peripheral lands of the patterned land arrangement at least partially has concave sections, and the concave section is in the form of a rectangular equilateral triangle which has, at its vertex, the land located at the deepest portion of the concave section (the black land in each of FIGS. 3B, 3C, 4B, 5C, and 6B) (or in the form approximating thereto). As described above, when "n" is an odd number, the lands can be diagonally arranged on the sides of a complete rectangular equilateral triangle having, at its rectangular vertex opposed to the hypotenuse (base), the land located at the deepest portion of the concave section, as shown in FIGS. 4B and 6B, whereas when "n" is an even number, a complete rectangular equilateral triangle is not formed. In the latter case, the concave section is in the form of pseudo-rectangular equilateral triangle having, at its rectangular vertex opposed to the hypotenuse (base), the land located at the deepest portion of the concave section, and a cutout at an intersection of its hypotenuse and one of equilaterals (at the right corner in FIGS. 3B and 3C, and at the left corner in FIG. 5C). The pseudo-rectangular equilateral triangle may also be regarded as a quadrilateral.

When such a complete or pseudo-rectangular equilateral triangle arrangement is employed under a condition where a single routing line can be passed through the adjacent lands of lattice pattern, the wiring lines of a number of k+(n−1) can be routed out of the concave section involving the sequence of consecutive lands of the number of "n", where "k" is the number of routing lines which can be arranged between the lands at the two extreme ends of the sequence when intermediate lands are eliminated, as earlier defined. This is because there are channels of a number of (n−1) in the sequence of lands of the number of "n", and an extra routing line can be passed through each of these channels when the complete or pseudo-rectangular equilateral triangle arrangement is employed.

In practice, the routing lines are arranged under a variety of conditions of land pitch, land diameter, line width, line space, number of the lands and the like, and how efficiently the wiring lines can be arranged varies case by case. It can be said, however, that arranging the peripheral lands, between which the routing lines from the inner region (the region surrounded by the outermost lands) are passed through, along the sides of a rectangular equilateral triangle is most efficient.

When a routing line pattern is designed in practice, the value of "n" is selected so as to satisfy at least the requirement $m \geq k+1$, and the lands, between which the routing lines from the inner region are passed through, are then selected as described above.

Figure 7:
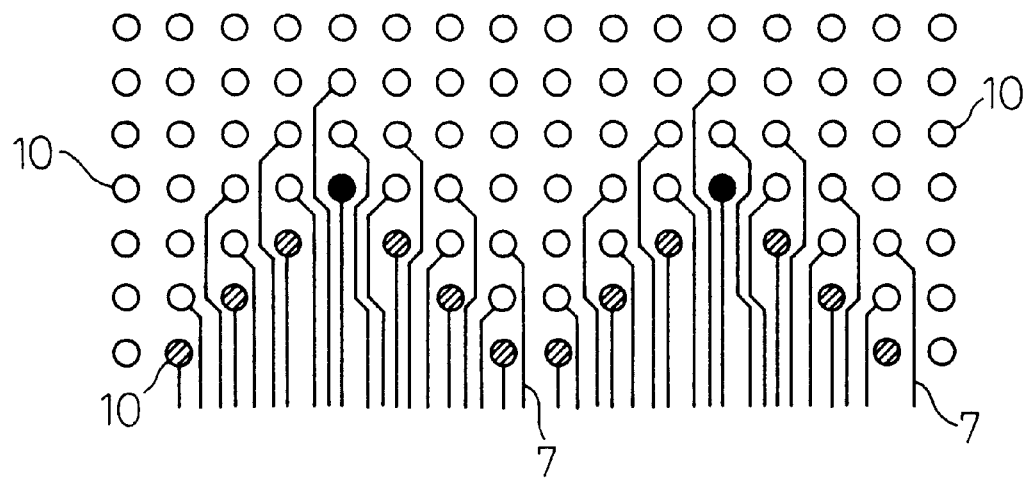
FIG. 7 illustrates further land and routing line patterns at n=7.

FIG. 7 illustrates a routing line pattern designed by selecting the lands, between which the routing lines from the inner region are passed through, according to the technique as described above, under the condition of n=7 and consecutive concave sections.

Figure 8:
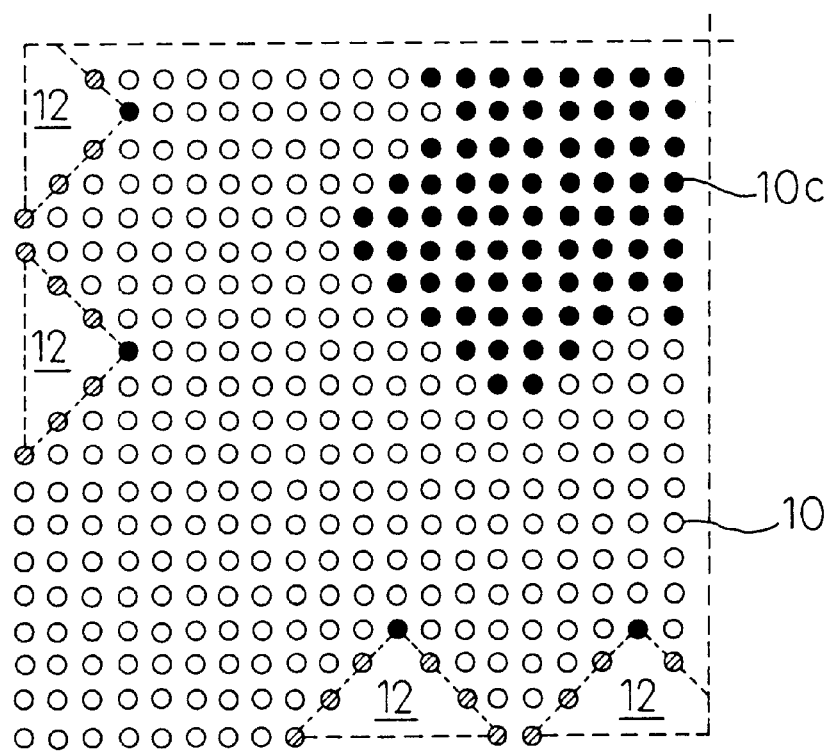
FIG. 8 illustrates a quarter part of a land pattern in a first wiring layer of a multilayer circuit board according to the invention.

For a multilayer circuit board, it is most effective that a first routing layer on which a chip or device is directly mounted, as well as other wiring layers, is designed so that at least some of peripheral lands, between which the wiring lines from the inner region are passed through, are arranged on the two equilaterals of a rectangular equilateral triangle to provide a concave section in the form of rectangular equilateral triangle. FIG. 8 illustrates a quarter part of a land pattern in a first routing layer of a multilayer circuit board, in which the lands 10 are arranged so that concave sections 12 appear at at least parts of the periphery of the land pattern, in a certain cycle, the concave section 12 being formed of the hatched lands located on equilaterals of a rectangular equilateral triangle and a land (which is blackened in the drawing) at its rectangular vertex.

In FIG. 8, there is no concave section at the portion near the corner of the land pattern (the lower left portion in the drawing). This is because, at the portion near the corner of the land pattern, lines are relatively easily routed from the inner region through between the outer lands and, accordingly, it is unnecessary to specially provide a concave section.

Also in FIG. 8, lands 10c (which are blackened in the drawing) for grounding or electrical power supply are provided in a center region of the land pattern, which can be connected to a common routing line. Consequently, lines, which are to be routed separately from each other, can be routed in the first routing layer of a multilayer circuit board (the top routing layer on which a semiconductor chip is mounted) according to the technique as described above, which enables the routing lines to be very efficiently arranged in a multilayer circuit board as a whole.

Figure 9:
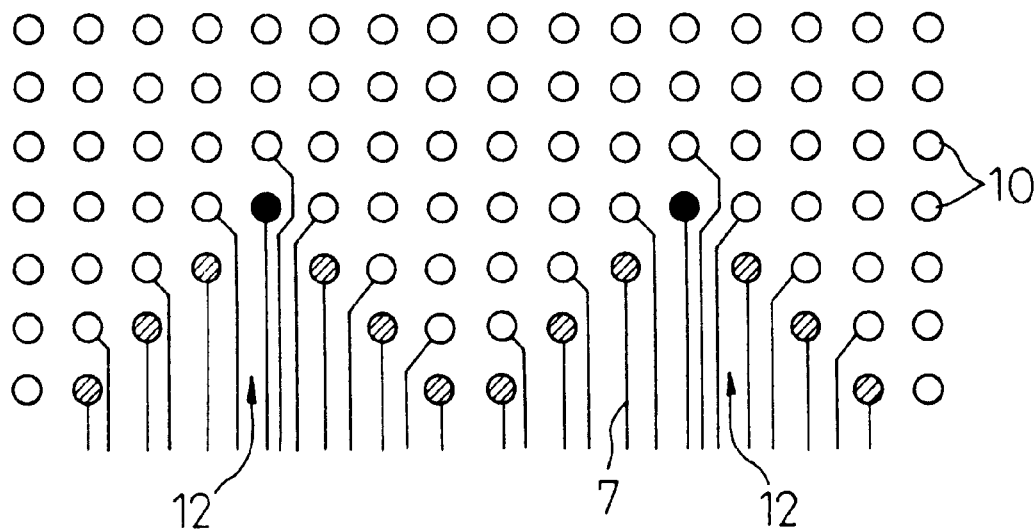
FIG. 9 illustrates a land pattern when n is an odd number.

The routing lines may be arranged in as a large number as possible for every concave section, as shown in FIG. 7. Alternatively, the lines may be routed only from the limited lands, i.e., the peripheral lands forming the concave section and the lands located immediately inside the peripheral lands, as shown in FIG. 9. In the latter case, routing layers of a multilayer circuit board subsequent to the routing layer (the first layer) having the above concave sections involving a limited number of lines can have exactly the same form of concave section as that of the first layer, i.e., the form enabling the lines to be efficiently routed from the inner region of the land pattern.

Figure 10:
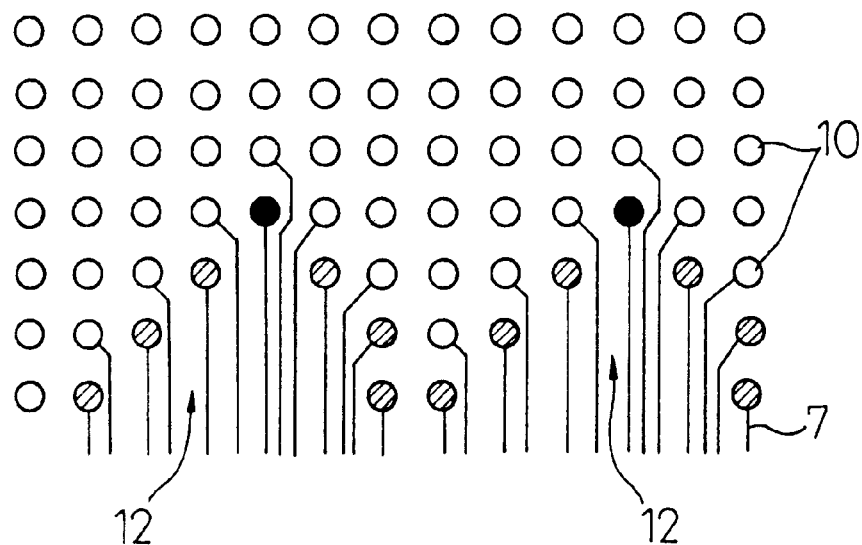
FIG. 10 illustrates a land pattern when n is an even number.

In FIG. 9, "n" is 7, an odd number. In the case of "n" of an even number, the routing lines may be arranged as shown in FIG. 10, for example. In FIGS. 9 and 10, the land located at the deepest portion of the concave section (the rectangular vertex of the rectangular equilateral triangle) is also blackened.

Figure 11A:
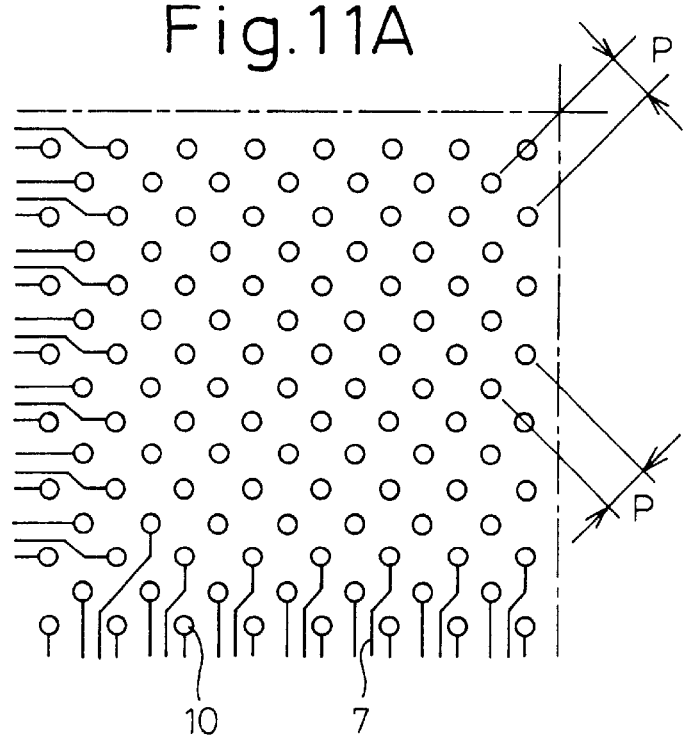
FIG. 11A illustrates a land arrangement of staggered type.
Figure 11B:
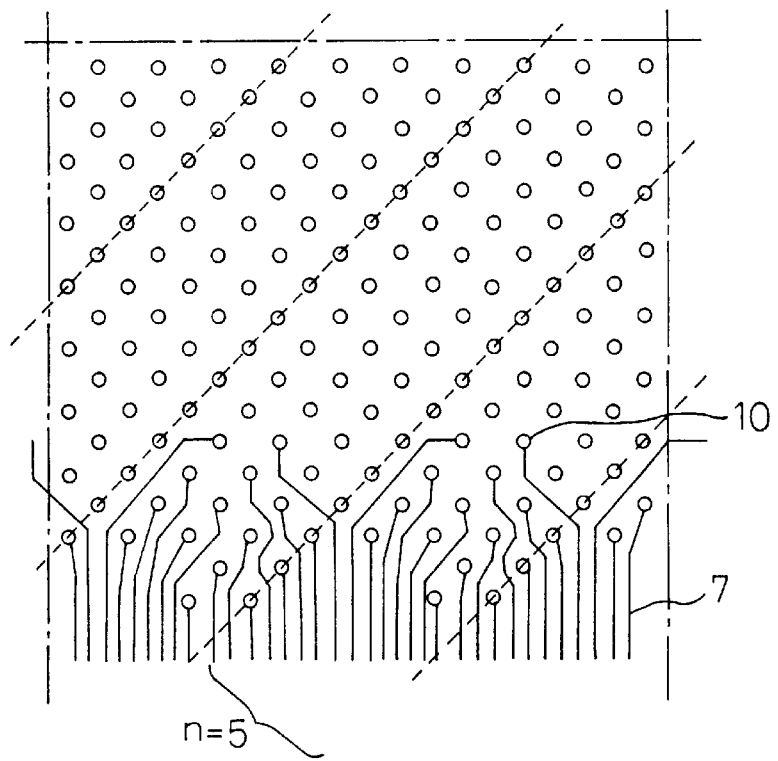
FIG. 11B illustrates land and routing line patterns at n=5 in a staggered land arrangement.
Figure 12:
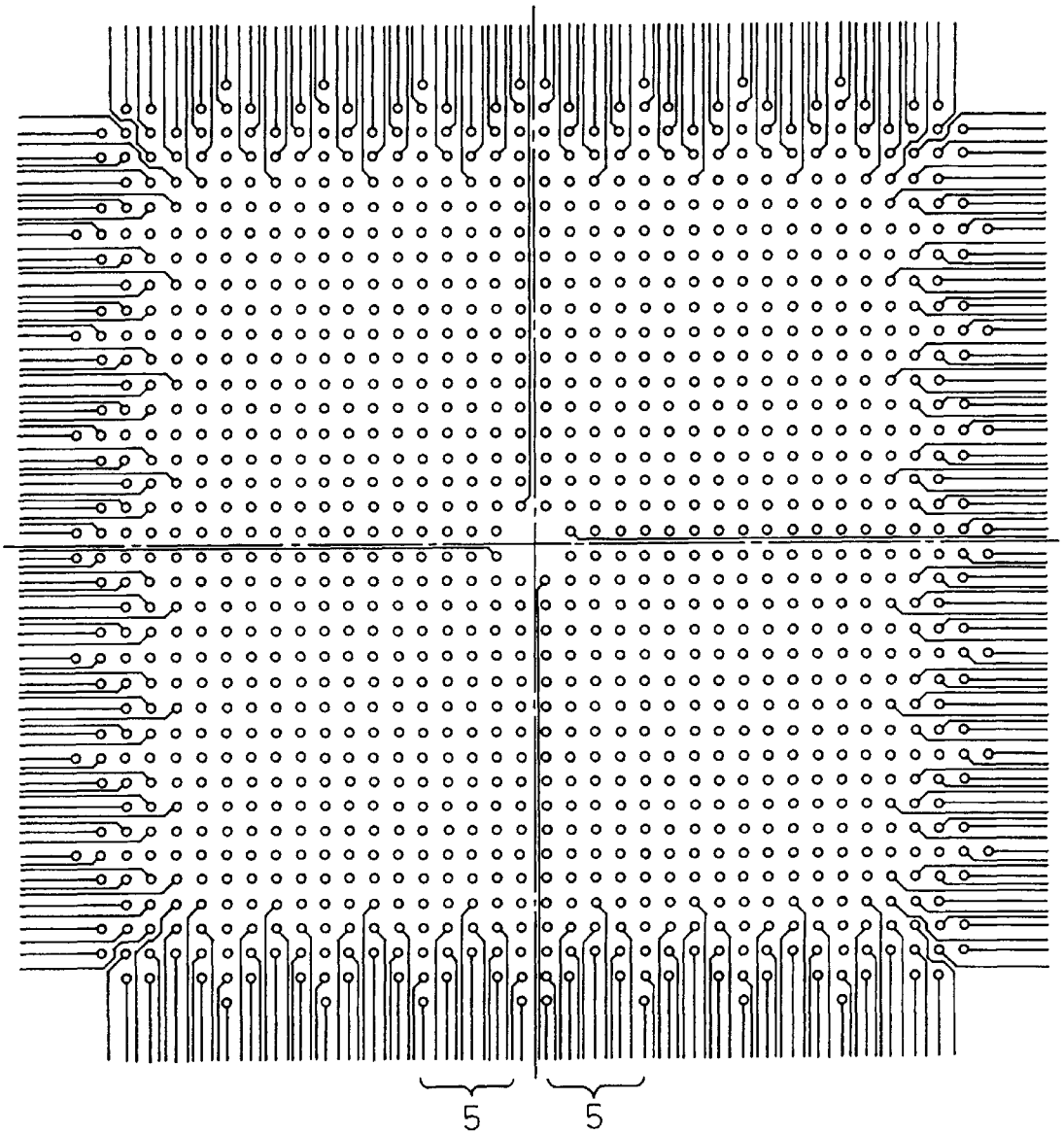
FIG. 12 illustrates land and routing line patterns in a first routing layer of a multilayer circuit board according to the invention.
Figure 13:
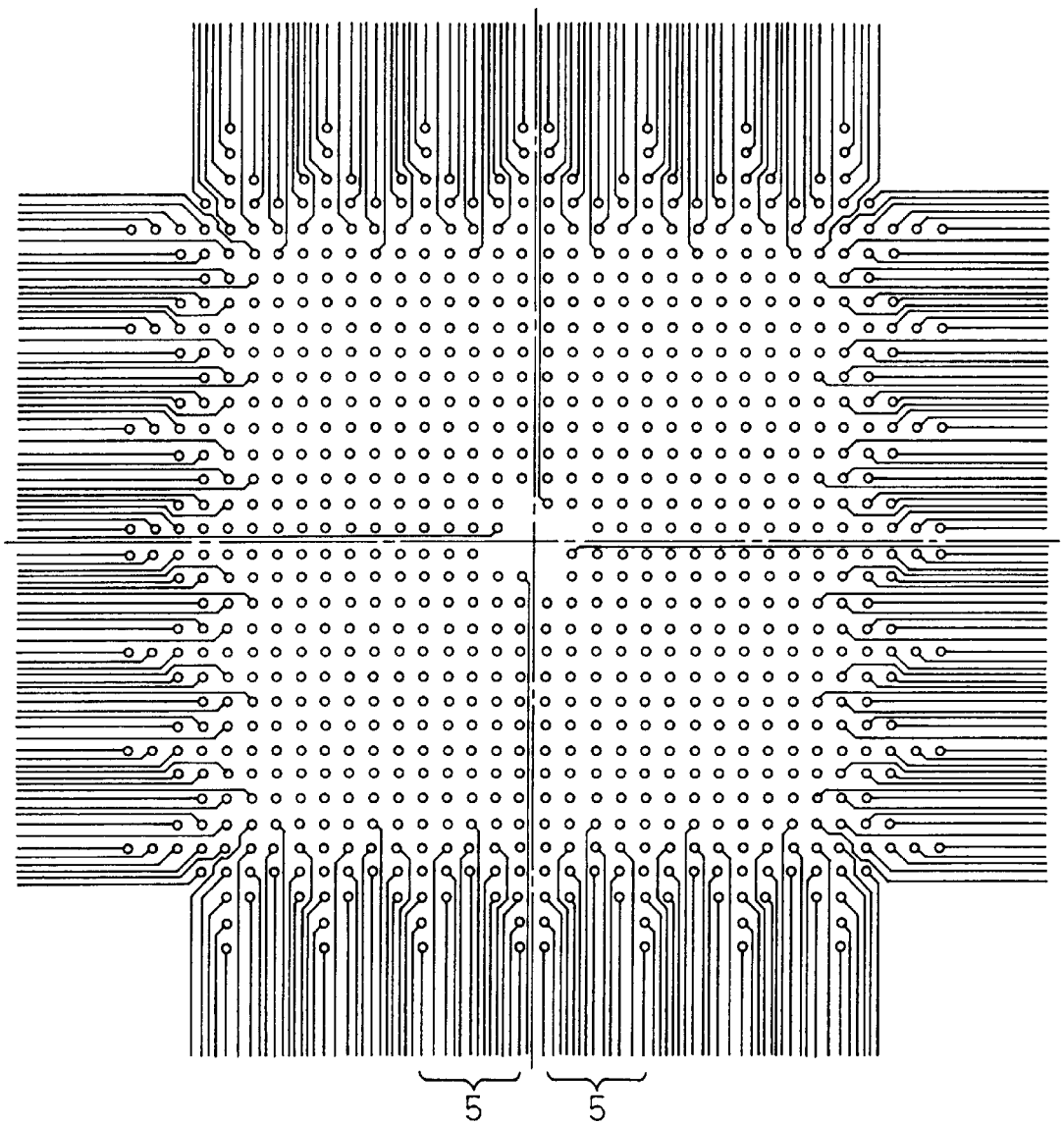
FIG. 13 illustrates land and routing line patterns in a second routing layer of a multilayer circuit board according to the invention.
Figure 14:
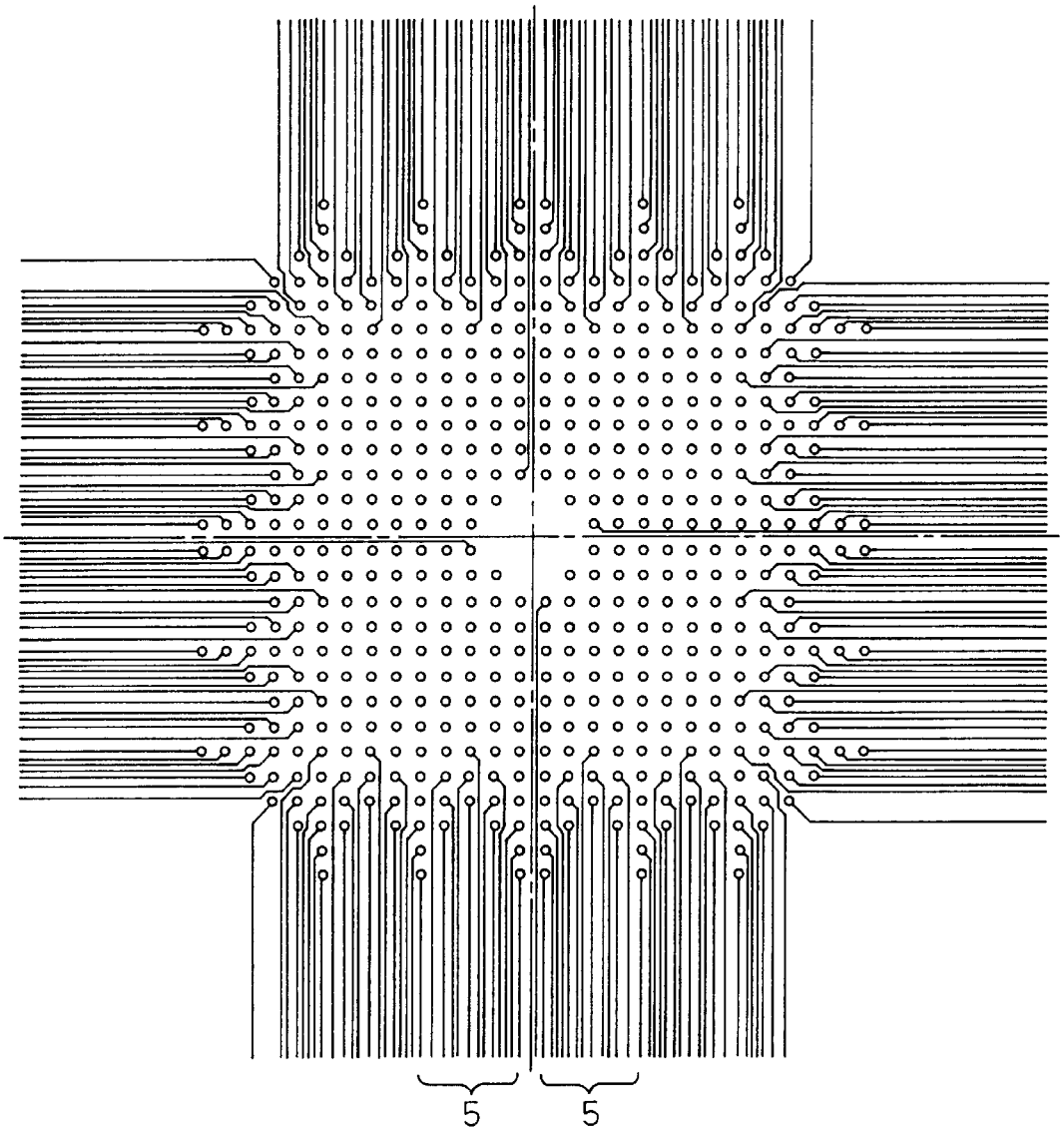
FIG. 14 illustrates land and routing line patterns in a third routing layer of a multilayer circuit board according to the invention.
Figure 15:
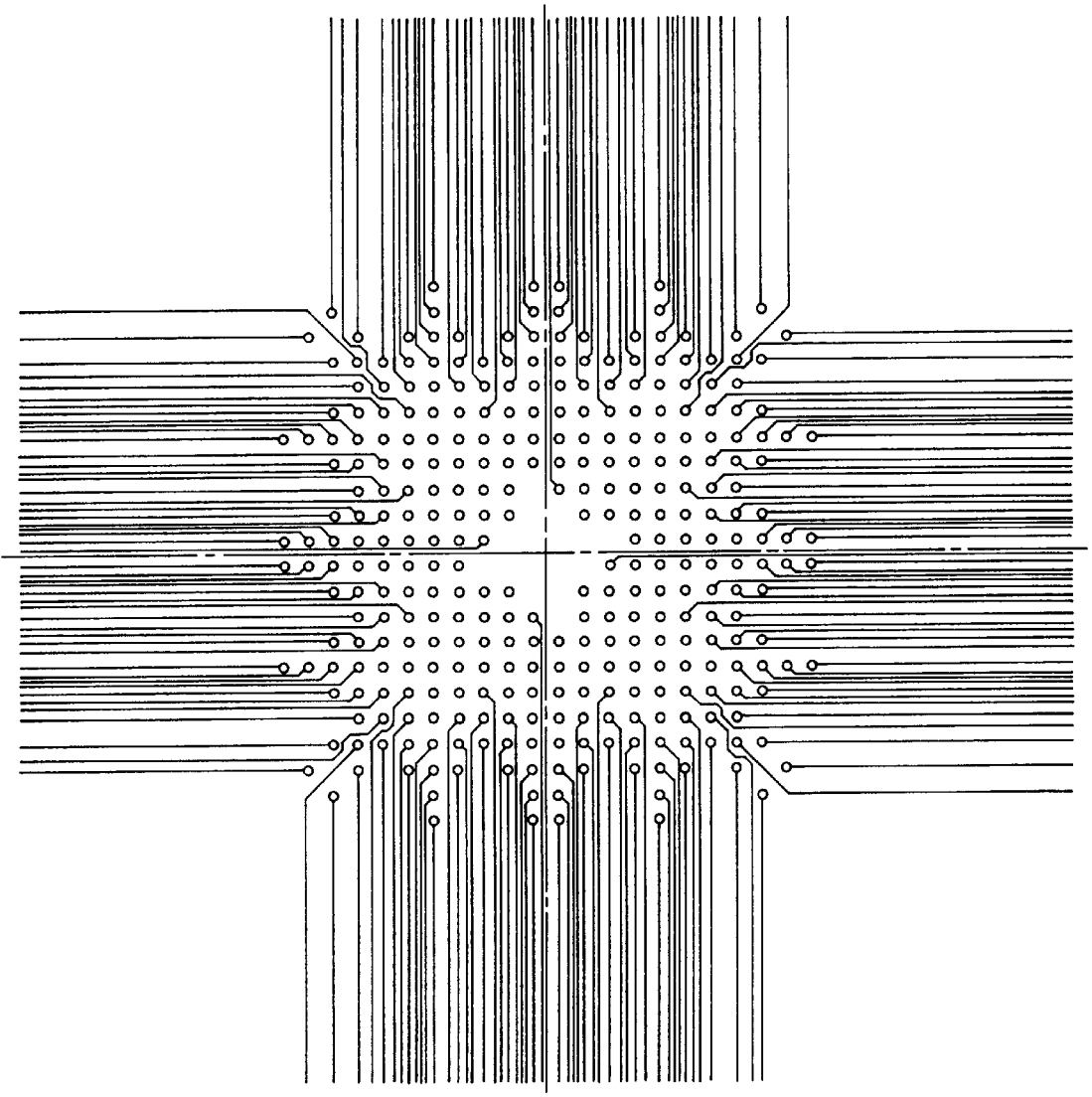
FIG. 15 illustrates land and routing line patterns in a fourth routing layer of a multilayer circuit board according to the invention.
Figure 16:
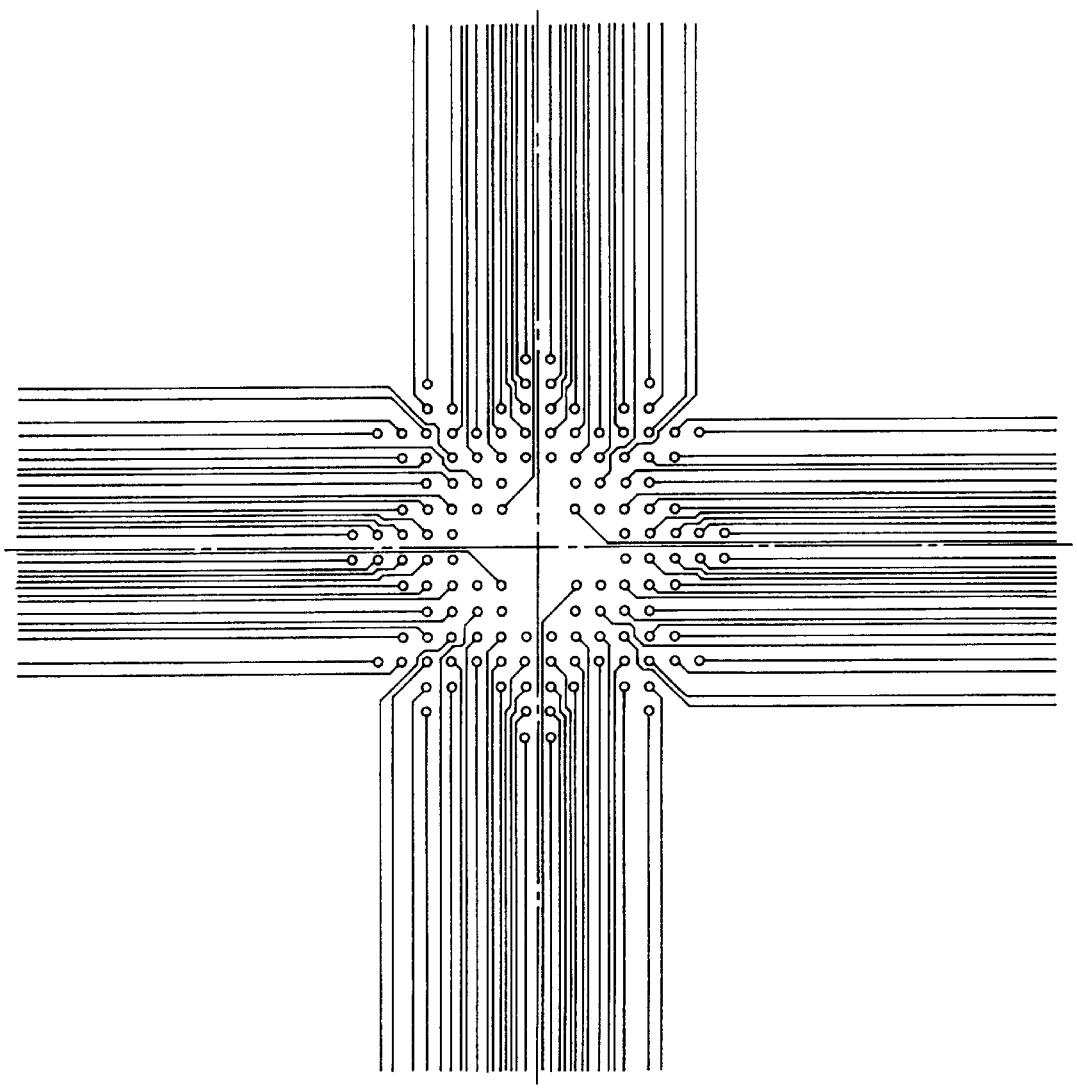
FIG. 16 illustrates land and routing line patterns in a fifth routing layer of a multilayer circuit board according to the invention.
Figure 17:
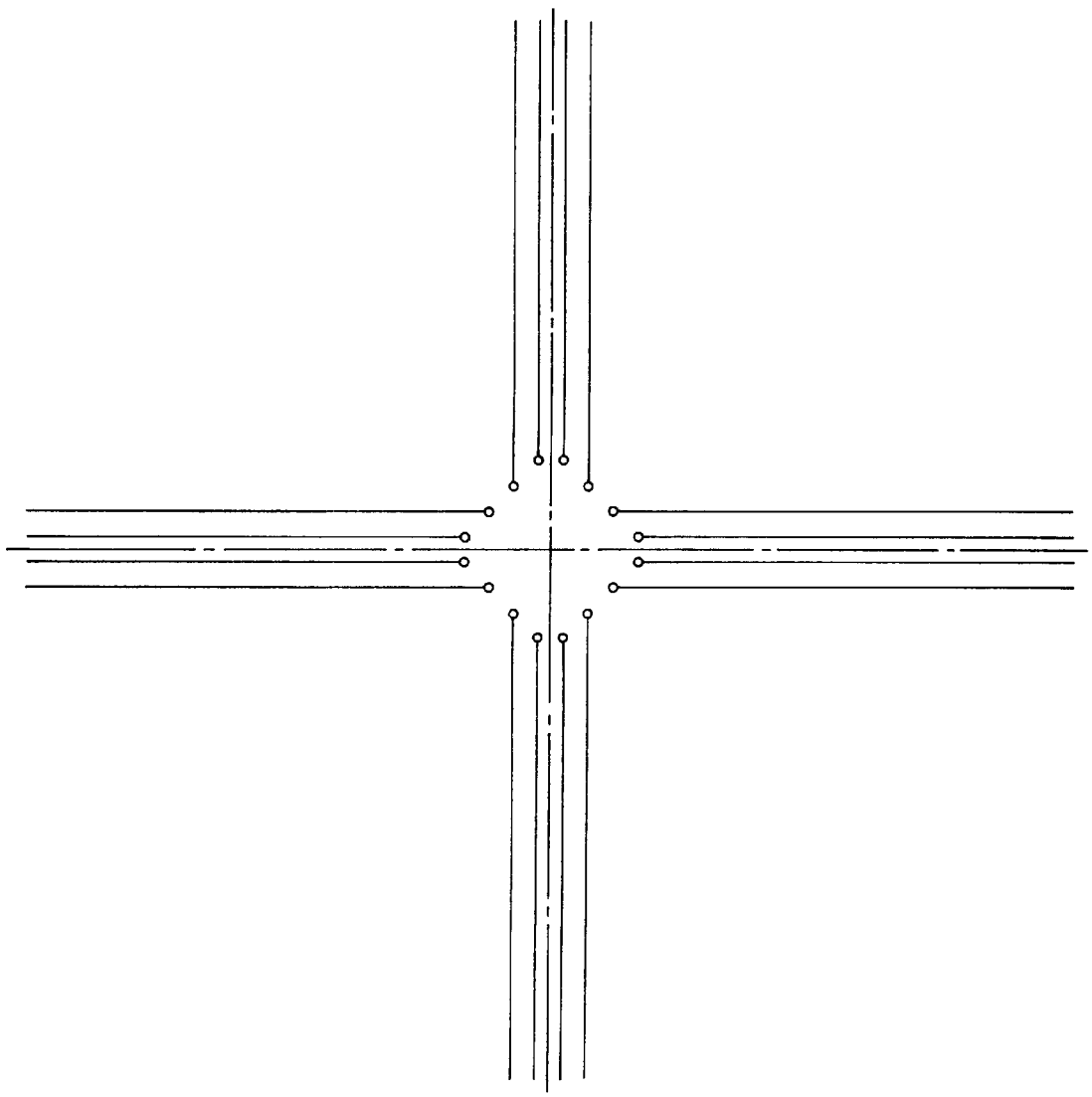
FIG. 17 illustrates land and routing line patterns in a sixth routing layer of a multilayer circuit board according to the invention.
Figure 18:
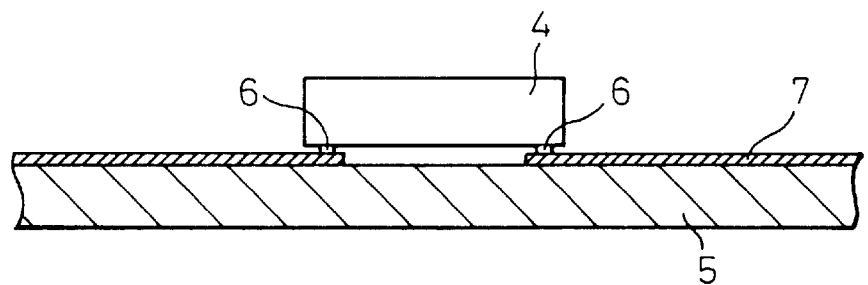
FIG. 18 illustrates flip chip bonding.
Figure 19:
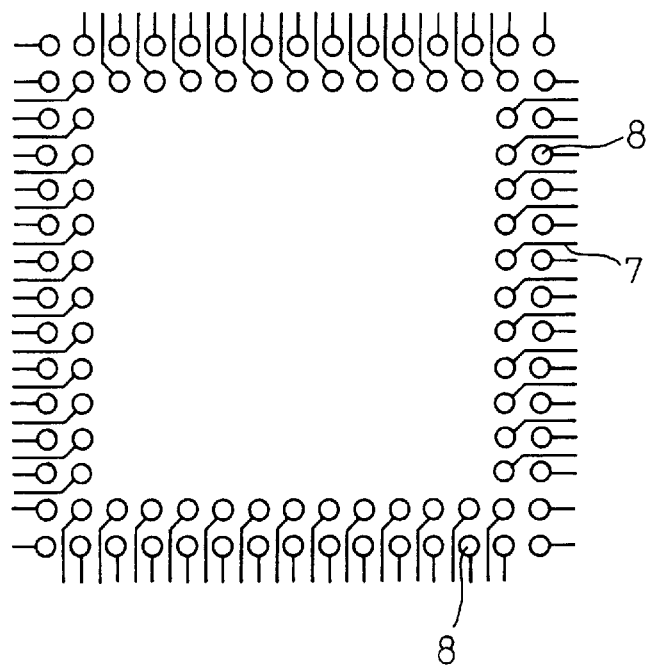
FIG. 19 illustrates land and routing line patterns in a conventional multilayer circuit board.
Figure 20:
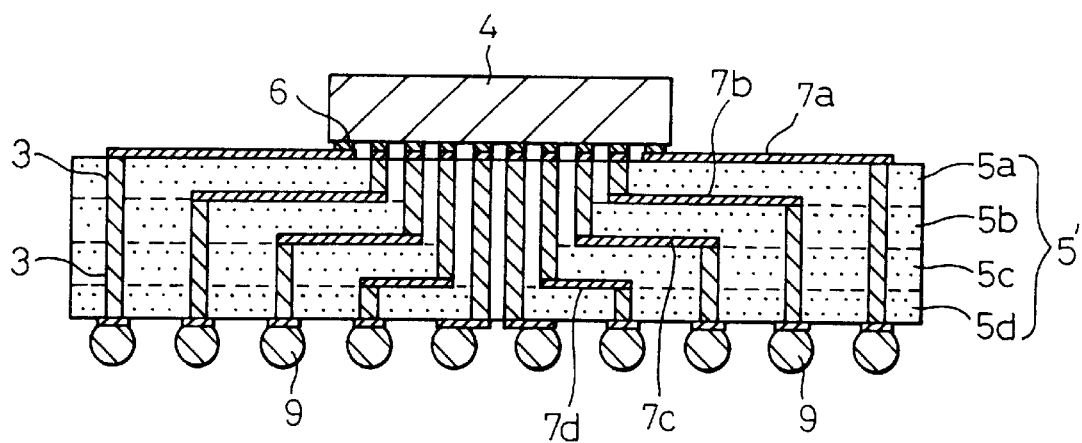
FIG. 20 illustrates a multilayer circuit board on which a semiconductor chip is mounted.

The foregoing description has been directed to the land arrangement of normal lattice pattern. The above idea for land arrangement can be applied to land arrangement of staggered pattern. As shown in FIG. 11A, a staggered arrangement can be regarded as a lattice arrangement when it is viewed from a diagonal direction. Accordingly, a routing line pattern can be designed by selecting the lands, between which routing lines from the inner region are to be passed through, in such a manner that they are diagonally arranged based upon a land pitch (which is indicated by P in the drawing), a land diameter, a line width, and a space between adjacent lines as viewed from a diagonal direction. FIG. 11B illustrates land and routing line patterns in a staggered land arrangement when n=5, which can increase the number of routing lines. Thus, the invention can be applied to either the land arrangement of normal lattice type or the land arrangement of staggered type.

The following non-limiting example will further describe the invention.

FIGS. 12 to 17 respectively illustrate arrangements of lands and routing lines in first to sixth routing layers of a multilayer circuit board for mounting an electronic part having 38×38 pins (electrodes) arranged in the form of a normal lattice. The lands and routing lines are designed under the following conditions.

| Land pitch: | 350 micrometers |
| Land diameter: | 120 micrometers |
| Line width: | 50 micrometers |

Space between adjacent lines: 50 micrometers

Under these conditions, a number of routing lines which can be pass through between adjacent lands, "a", is 1. Assuming n=5, then, $$k=a(n-1)+(n-2)=2n-3=7,$$

$$m=[350\times(5-1)-120-50]/(50+50)\approx 12.3.$$

These satisfy the requirement $m \geq k+1$. Thus, this example illustrates a set of routing layers of a multilayer circuit board when n=5.

In each of the routing layers, lines are thus routed from the groups each consisting basically of five rows of lands. In this example, some of sets of adjacent concave sections of rectangular equilateral triangular have a common land at their ends. In practical design of land pattern, adjacent concave sections may have a common land at their ends, as in this example, or may respectively have a land located at their ends opposed to each other, as illustrated in FIGS. 7 to 10. In other words, adjacent groups of lands may have a common row of lands at their ends, or may respectively have a row of lands at their ends adjacent to each other.

Viewing the same group of lands for every routing layer, the lines are routed, first, from the outer side of the land group and, then, gradually from the inner sides as the order of the routing layer advances. In this example, six routing layers are required for routing the lines from every land. However, the lands remain only in a small number on the final sixth routing layer (FIG. 17), and the routing is substantially completed on the fifth layer. In contrast, when lines are routed for the same number of lands as in this example without using a concave section, a total of 8 wiring layers are required.

In an empty space on the sixth layer of this example (FIG. 17), lands which can be commonly used, such as grounding lands, may be arranged.

As described, according to the invention, a first routing layer of a multilayer circuit board on which a chip is mounted can be used, the layer being provided with a land pattern having concave sections, preferably in a certain cycle, at at least parts of its periphery. The first layer provided with the land pattern having concave sections allows routing lines to be efficiently arranged, resulting in the reduction in the number of routing layers required for a multilayer circuit board.

What is claimed is:

1. A multilayer circuit board for mounting thereon an electronic part provided with electrodes formed in a certain pattern, which comprises a plurality of laminate routing layers, each of the routing layers being provided with lands and routing lines on its surface, the lands being arranged in a region of the circuit board to conform to the pattern of the electrodes of the electronic part, having vias going through each routing layer for electrical conduction from one side to the other side of the routing layer, wherein electrical contact can be made between adjacent routing layers, and each routing line being connected at its end to a land, and being routed toward the outside of the region where the lands are arranged, wherein the lands on each of the routing layers are arranged to have a pattern in which a closed virtual line is formed by consecutively linking the peripheral lands of the pattern which closed virtual line includes a concave section oriented inward.

2. The multilayer circuit board of claim 1, wherein the concave section is formed by two adjacent legs of a rectangular equilateral triangle, and the peripheral lands for that concave section are located along the sides of the rectangular equilateral triangle.

3. The multilayer circuit board of claim 1, wherein the concave section is formed by two adjacent legs of a pseudo-rectangular equilateral triangle having a rectangular vortex at which one of the peripheral lands is located, and a cutout at an intersection of its hypotenuse and one of the equilaterals.

4. The multilayer circuit board of claim 1 wherein the pattern is a rectangular lattice.

5. The multilayer circuit board of claim 1 wherein the pattern is a staggered lattice.

6. The multilayer circuit board of claim 4 wherein the concave section is formed by two adjacent legs of a rectangular equilateral triangle, and the peripheral lands for that concave section are located along the sides of the rectangular equilateral triangle.

7. The multilayer circuit board of claim 5, wherein the concave section is formed by two adjacent legs of a pseudo-rectangular equilateral triangle having a rectangular vortex at which one of the peripheral lands is located, and a cutout at an intersection of its hypotenuse and one of the equilaterals.

8. The multilayer circuit board of claim 6, wherein no lands are present t within the confines of the concave section.

9. The multilayer circuit board of claim 7, wherein no lands are present within the confines of the concave section.

10. The multilayer circuit board of claim 8, wherein the size of the concave section is determined by the length of the hypotenuse of the equilateral triangle which hypotenuse length is measured by "n" the number of lands along that hypotenuse, wherein "n" is determined by solving the following equation:

$$\text{(number of routing lines to extend through the concave section)} = [(\text{land pitch}) \times (n-1) - (\text{land diameter}) - (\text{space between routing lines})] \div (\text{routing line width} + \text{space between routing lines}).$$

11. The multilayer circuit board of claim 9, wherein the size of the concave section is determined by the length of the hypotenuse of the pseudo-equilateral triangle which hypotenuse length is measured by "n" the number of lands along that hypotenuse, wherein "n" is determined by solving the following equation for "n":

$$\text{(number of routing lines to extend through the concave section)} = [(\text{land pitch}) = (n-1) - (\text{land diameter}) - (\text{space between routing lines})] \div (\text{routing line width} + \text{space between routing lines}).$$

12. A multilayer circuit board for mounting thereon an electronic part provided with electrodes formed in a certain pattern, comprising:

a plurality of laminate routing layers;

wherein each of the routing layers is provided with lands and routing lines on its surface, the lands being arranged a pattern to conform to the pattern of said electrodes of said electronic part;

vias going through each routing layer for electrical conduction from one side to the other side of the routing layer, wherein electrical contact can be made between adjacent routing layers;

wherein each routing line is connected at its end to a respective land, and is routed toward the outside of the pattern of lands; and wherein the lands on each of the routing layers are arranged to have a sub-pattern of removed lands to provide space for routing lines extending from lands on the inside of the pattern to the outside of the pattern, said sub-pattern defining a triangular concave section wherein the hypotenuse thereof is an extension along the peripheral of the pattern.

13. The multilayer circuit of board claim 12, wherein said pattern includes at least one said subpattern.

14. The multilayer circuit board of claim 13, wherein the size of each said pattern is determined by the number of lands removed including the number of lands removed on said sub-pattern hypotenuse.

15. The multilayer circuit board of claim 14, wherein the number of lands removed on said sub-pattern hypotenuse is determined by solving the following equation for "n":

(number of routing lines to extend through the concave section)= [(land pitch)×(n−1)−(land diameter)−(space between routing lines)]÷(routing line width+space between routing lines).

16. A multilayer circuit board for mounting thereon an electronic part having a plurality of electrodes formed in a certain pattern, comprising:
   a plurality of laminate routing layers, each layer having lands and routing lines on its surface, said lands being arranged in a pattern to conform to the pattern of said electrodes pattern;
   conductive vias passing through each routing layer for electrical conduction from one routing layer to the adjacent routing layer;
   wherein each routing line is connected at its end to a land, and is routed to the outside of the pattern of lands; and
   wherein the lands on each of the routing layers contain a plurality of rectangular equilateral triangle like sections along the periphery of said pattern which are each absent of lands to provide space for routing lines extending from interior lands to the outside periphery of said pattern, the number of rectangular equilateral triangular like sections being determined by the size of the pattern and thereby minimizing the number of laminate routing layers needed.

17. The multilayer circuit board of claim 16 wherein at least one of said rectangular equilateral triangle like sections includes a cutout at the intersection of its hypotenuse and one of its equilaterals.

18. The multilayer circuit board of claim 16 wherein the size of each said rectangular equilateral triangle like section is determined by the length of its hypotenuse as determined by the number of absent lands along that hypotenuse, this number "n" is determined by solving the following equation for "n":

(number of routing lines to extend through the concave section)= [(land pitch)×(n−1)−(land diameter)−(space between routing lines)]÷(routing line width+space between routing lines).

19. The multilayer circuit board of claim 17 wherein the size of each said rectangular equilateral triangle like section with said cutout is determined by the length of its hypotenuse as determined by the number of absent lands along that hypotenuse, this number "n" is determined by solving the following equation for "n":

(number of routing lines to extend through the concave section)= [(land pitch)×(n−1)−(land diameter)−(space between routing lines)]÷(routing line width+ space between routing lines).

\* \* \* \* \*